(12) United States Patent
Lu et al.

(10) Patent No.: US 7,153,765 B2
(45) Date of Patent: Dec. 26, 2006

(54) METHOD OF ASSEMBLING SOLDERED PACKAGES UTILIZING SELECTIVE SOLDER DEPOSITION BY SELF-ASSEMBLY OF NANO-SIZED SOLDER PARTICLES

(75) Inventors: Daoqiang Lu, Chandler, AZ (US); Tian-An Chen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/096,238

(22) Filed: Mar. 31, 2005

(65) Prior Publication Data

US 2006/0226203 A1 Oct. 12, 2006

(51) Int. Cl.
*H01L 21/44* (2006.01)
*B23K 31/02* (2006.01)

(52) U.S. Cl. .................. 438/613; 438/798; 228/180.21; 228/180.22

(58) Field of Classification Search ..................... None
See application file for complete search history.

(56) References Cited

U.S. PATENT DOCUMENTS

| 4,273,859 | A | * | 6/1981 | Mones et al. | ............... | 438/614 |
| 4,661,375 | A | * | 4/1987 | Thomas | ...................... | 438/614 |
| 4,950,623 | A | * | 8/1990 | Dishon | ........................ | 438/614 |
| 5,877,078 | A | * | 3/1999 | Yanagida | .................... | 438/612 |

FOREIGN PATENT DOCUMENTS

JP          04116831 A  *  4/1992

* cited by examiner

*Primary Examiner*—Alonzo Chambliss
(74) *Attorney, Agent, or Firm*—Schwegman, Lundberg, Woessner & Kluth, P.A.

(57) ABSTRACT

A nano-sized solder suspension flows by selective wetting onto a bond pad and away from a bond-pad resist area. A microelectronic package is also disclosed that uses the nano-sized solder suspension. A method of assembling a microelectronic package is also disclosed. A computing system is also disclosed that includes a bump that was reflowed from the nano-sized solder suspension.

23 Claims, 5 Drawing Sheets

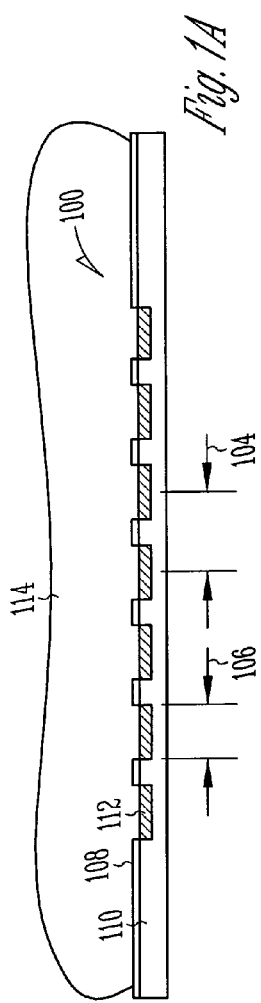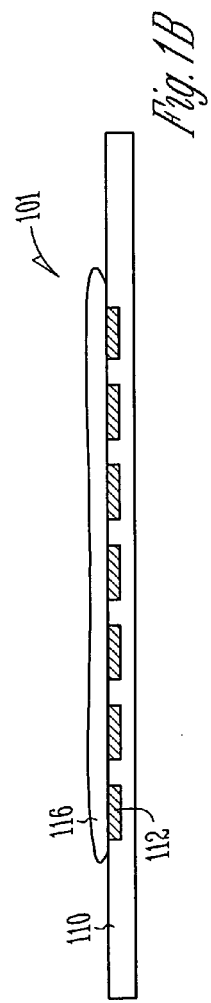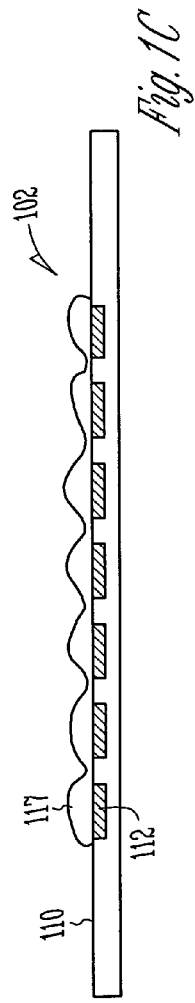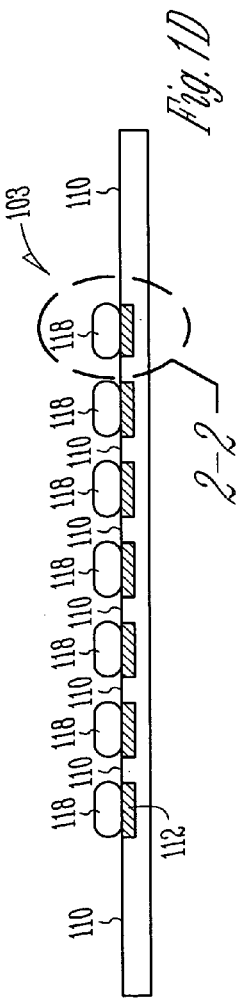

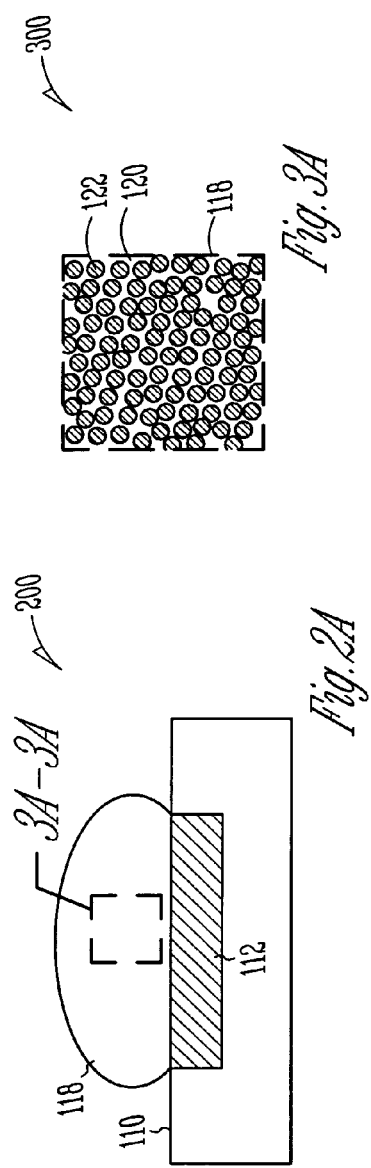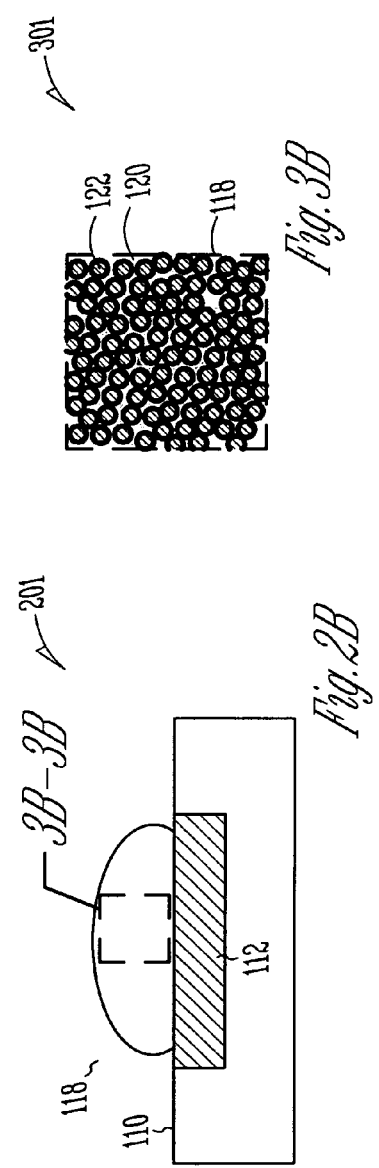

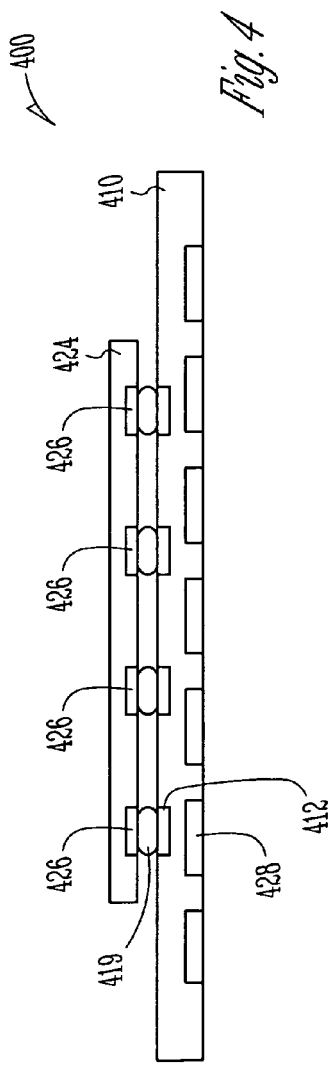
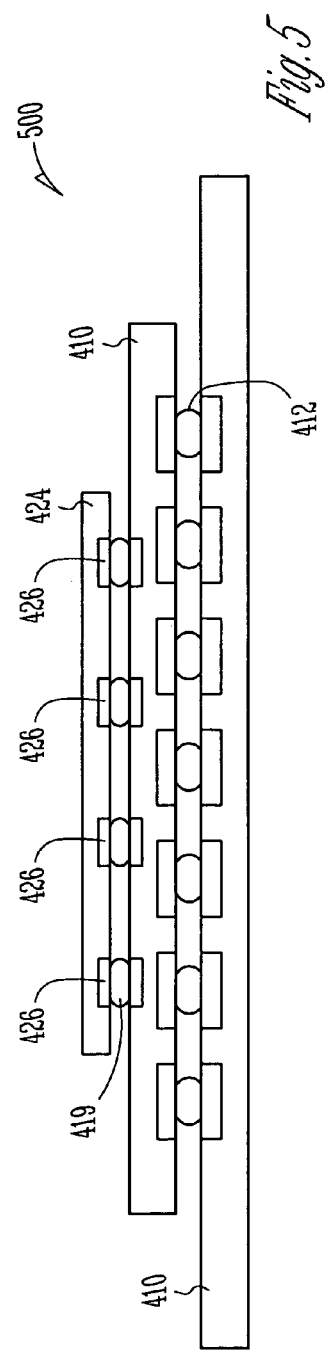

US 7,153,765 B2

METHOD OF ASSEMBLING SOLDERED PACKAGES UTILIZING SELECTIVE SOLDER DEPOSITION BY SELF-ASSEMBLY OF NANO-SIZED SOLDER PARTICLES

TECHNICAL FIELD

Disclosed embodiments relate to solder particles in a solder precursor for use in a microelectronic device package.

An integrated circuit (IC) die is often fabricated into a processor for various tasks. IC operation invariably leads to heat generation and thermal expansion stresses in a die package. Higher melting-point solders, although they withstand the high operating temperatures caused by the densely packed circuitry on a die, are costly to the thermal budget during fabrication.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which:

FIG. 1A is an elevational cross-section of a substrate for a microelectronic device during processing according to an embodiment;

FIG. 1B is an elevational cross-section of the substrate depicted in FIG. 1A after further processing according to an embodiment;

FIG. 1C is an elevational cross-section of the substrate depicted in FIG. 1B after further processing according to an embodiment;

FIG. 1D is an elevational cross-section of the substrate depicted in FIG. 1C after further processing according to an embodiment;

FIG. 2A is detail section taken from FIG. 1D according to an embodiment;

FIG. 2B is the detail section taken from FIG. 1D during further processing according to an embodiment;

FIG. 3A is a detail section taken from FIG. 2A according to an embodiment;

FIG. 3B is a detail section taken from FIG. 2B according to an embodiment;

FIG. 4 is a cross section of a microelectronic device package during an assembly method according to an embodiment;

FIG. 5 is a cross section of a microelectronic device package during an assembly method according to an embodiment;

DETAILED DESCRIPTION

Figure 6:
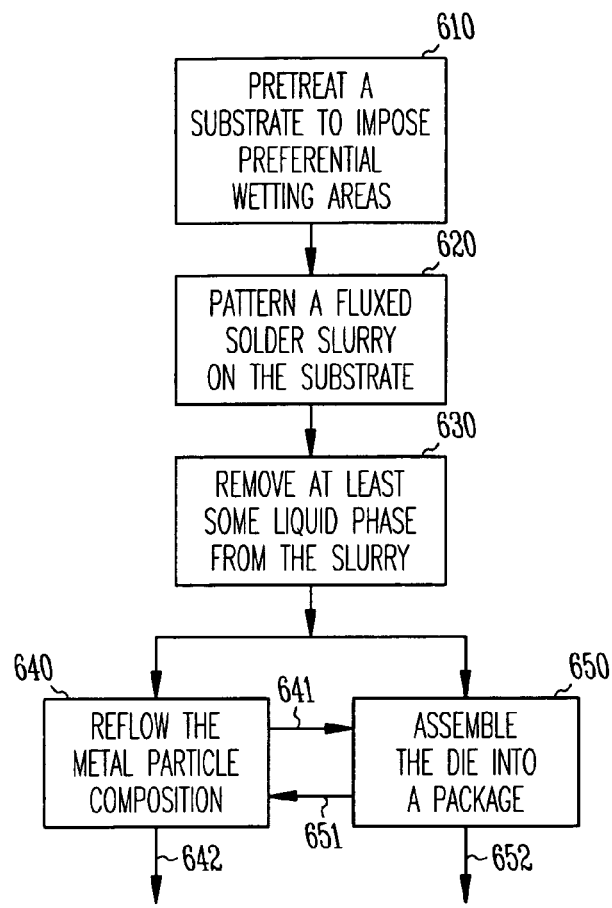
FIG. 6 is a process flow diagram according to various embodiments.

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

FIG. 1A is an elevational cross-section of a substrate 100 for a microelectronic device during processing according to an embodiment. The substrate 100 includes a board 110 and a plurality of bond pads, one of which is designated with reference numeral 112. The board 110 is depicted as intermittent to the plurality of bond pads 112, which therefore provides a bond-pad resist area 108 bordering any given bond pad 112.

In an embodiment, the board 110 is a microelectronic device such as a wafer 110 or a die 110 that has been singulated from a wafer.

In an embodiment, the bond pad 112 is a copper metal pad. In an embodiment, the bond pad 112 is a copper metal pad with a nickel first layer. In an embodiment, the bond pad 112 is a copper metal pad with a nickel first layer and a gold upper layer, which are applied to the copper metal pad by electroless plating techniques. In the embodiment depicted in FIG. 1A, the bond-pad resist area 108 is covered with an organic solder resist 108, although the organic solder resist can be absent, such as is depicted in FIG. 1B.

The bond pads include an edge dimension 106 in a range from about 50 micrometer to about 150 micrometer according to an embodiment. The bond-pad resist area 108 is disposed between any two adjacent bond pads 112 that share an edge border. In an embodiment, the bond pads 112 are spaced upon the bond-pad resist area 108 such that where a given bond pad 112 has an edge-dimension 106 of unity, two adjacent bond pads are spaced 104 on centers having a dimension of about 1.5 times unity. In other words, the pitch of the bond pads 112 is 1.5 times the edge dimension. Other pitches can be used depending upon specific applications.

In an embodiment, the board 110 is part of a printed wiring board (PWB) such as a main board. In an embodiment, the board 110 is part of an interposer. In an embodiment, the board 110 is part of a mezzanine PWB. In an embodiment, the board 110 is part of an expansion card PWB. In an embodiment, the board 110 is part of a small PWB such as a board for a handheld device such as a cell phone or a personal digital assistant (PDA).

In an embodiment, the bond pads 112 and the bond-pad resist area 108 exhibit different wetting characteristics to either water-based fluids or organic-based fluids. Initial processing can be conducted to create an enhanced differential in wetting response between the bond pads 112 and the bond-pad resist area 108. During initial processing, a differential in wetting response is imposed on the substrate 100 at various regions according to an embodiment.

Processing of the substrate 100 includes pretreating the organic solder resist 108, if present, and the bond pads 112 to cause the bond pads 112 to become hydrophilic and the organic solder resist 108 to become hydrophobic according to an embodiment. In an embodiment, pretreating commences with first exposing the substrate 100 to an oxygen ($O_2$) plasma 114. Pretreating continues with second exposing the substrate 100 to a carbon tetrafluoride ($CF_4$) plasma. In an embodiment, pretreating includes soaking the substrate using ethanolic alkanethiol [$CH_3$ $(CH_2)_n$ SH] solution to cause the bond pad to be solder-suspension philic and the solder-resist area to be solder-suspension phobic The pretreating achieves the imposing of a differential wetting response upon the substrate for a water-bases material. The pretreating is useful with a solder suspension that includes a water-based material as its principal wetting fluid. In an embodiment, the solder suspension responds mostly like a water-based material in its wetting characteristics.

In an embodiment, pretreating of the substrate 100 includes pretreating the bond-pad resist area 108 and the bond pads 112 to cause the bond pads 112 to become hydrophobic and the bond-pad resist area 108 and/or the organic solder resist 108 to become hydrophilic. The pretreating achieves the imposing of a differential wetting response upon the substrate for an organic-based material. The pretreating is useful with a solder suspension that includes an organic-based material as its principal wetting fluid. In an embodiment, the solder suspension responds mostly like an organic-based material in its wetting response.

In an embodiment, the pretreating process makes certain structures on the substrate 100 to be "philic" and others "phobic" of the liquid in the solder suspension. By "philic" it is meant that the liquid tends to wet more likely on a given structure such as the bond pad 112, than on the bond-pad resist area 108. By "phobic" it is meant that the liquid tends to wet less likely on a given structure such as the bond-pad resist area 108 than on the bond pad 112.

FIG. 1B is an elevational cross-section of the substrate depicted in FIG. 1A after further processing according to an embodiment. The substrate 101 has been processed to include a solder suspension 116 that has been applied to the substrate 101. In an embodiment, the solder suspension 116 has been applied to the substrate 101 by dipping the substrate 101 into a solder suspension bath. In an embodiment, the solder suspension 116 has been applied to the substrate 101 by spraying a solder suspension mass 116 onto the substrate 101. In an embodiment, the solder suspension 116 has been applied to the substrate 101 by spinning the solder suspension 116 onto the substrate 101 in a manner that allows the suspension 116 to be substantially uniform across the plurality of the solder pads 112.

As depicted in FIG. 1B, the solder suspension 116 appears to be substantially uniform in thickness across the substrate 101. In an embodiment, the substantially uniform thickness of the solder suspension 116 is a transient state, as the wetting responses of the bond pad 112 and the bond-pad resist area 108 are substantially different.

FIG. 1C is an elevational cross-section of the substrate depicted in FIG. 1B after further processing according to an embodiment. The substrate 102 and the solder suspension 117 depict a substantial change in the appearance of the solder suspension 116 depicted in FIG. 1B, and the transient state of the solder suspension 117 depicted in FIG. 1C. As depicted, the solder suspension 117 has begun to concentrate above the bond pads 112 and to thin out above the bond-pad resist area 108. This phenomenon is due to the different wetting responses of the bond pad 112 and the bond-pad resist area 108 with respect to the solder suspension 117.

FIG. 1D is an elevational cross-section of the substrate depicted in FIG. 1C after further processing according to an embodiment. The substrate 103 and the solder suspension 118 depict a substantial change in the appearance of the solder suspension 117 illustrated in FIG. 1C, and the changed configuration of the solder suspension 117 depicted in FIG. 1C. As depicted, the solder suspension 118 has concentrated above the bond pads 112 and has thinned out above the bond-pad resist area 108. This phenomenon is due to the different wetting responses of the bond pad 112 and the bond-pad resist area 108 with respect to the solder suspension 118. Accordingly, the solder suspension 118 exhibits macroscopic surface tension, such that the solder suspension 118 remains in a substantially solder-suspended state, but exhibits a substantial beading effect as it resists wetting on the bond-pad resist area 108.

FIG. 2A is detail section 200 taken from FIG. 1D according to an embodiment. The section line 2 in FIG. 1D illustrates schematically a portion of the board 110 along with the solder suspension 118, the bond pad 112 and the bond-pad resist area 108. The substrate 200 in FIG. 2A illustrates that the solder suspension 118 has retracted to the boundary between the bond pad 112 and the bond-pad resist area 108 according to the wetting responses of the solder suspension 118 as it relates to the bond pad 112 and the bond-pad resist area 108.

FIG. 3A is a detail section 300 taken from FIG. 2A according to an embodiment. The section line 3 in FIG. 2A illustrates schematically a portion of the solder suspension 118 while it remains substantially fluid with respect to adhesion to the bond pad 112 (FIG. 2A). The solder suspension 118 is depicted in substantially two phases. In an embodiment the solder suspension 118 includes a fluid phase 120 and a solid phase 122. The fluid phase 120 is depicted as a fluid that fills the interstices between particle of the solid phase. In an embodiment, the fluid phase 120 includes the principal fluid such as a water-based fluid with an inorganic flux. In an embodiment, the fluid phase 120 includes the principal fluid such as an organic-based fluid with an inorganic flux. In an embodiment, the fluid phase 120 includes the principal fluid such as an organic-based fluid with an organic flux.

The solid phase 122 is depicted as a dispersion of solder particles that have an average diameter in a range from about 5 nanometer (nm) to about 1,000 nm. In an embodiment, the solid phase 122 is a dispersion of solder particles that have a size characteristic of about 90% passing 20 nm. In an embodiment, the solid phase 122 is a dispersion of solder particles that have a size characteristic of about 80% passing 20 nm. In an embodiment, the solid phase 122 is a dispersion of solder particles that have a size characteristic of about 70% passing 20 nm. In an embodiment, the solid phase 122 is a dispersion of solder particles that have a size characteristic of about 60% passing 20 nm. In an embodiment, the solid phase 122 is a dispersion of solder particles that have a size characteristic of about 50% passing 20 nm.

In an embodiment, the solder suspension 118 behaves as a system in the Stokes regime of flow, such that the solid phase 122 settles much more slowly than a particle that falls through a Newtonian fluid. The Stokes regime of solid-particle flow in a fluid can be ascertained from the particle size, the fluid viscosity, and the respective densities thereof. In an embodiment, a given particle of the solid phase 122, settles in the fluid phase 120 with a characteristic Reynolds number in a range from about 0.01 to about 0.2. In an embodiment, a given particle of the solid phase 122, settles in the fluid phase 120 with a characteristic Reynolds number of about 0.1.

In an embodiment, the percent solids of the solder suspension 118 is in a range from about 10% to about 90%. In an embodiment, the percent solids is in a range from about 20% to about 70%. In an embodiment, the percent solids is in a range from about 40% to about 50%.

In an embodiment, the liquid phase 120 includes a water base and an inorganic flux. In an embodiment, the inorganic flux includes an inorganic acid such as hydrochloric acid, hydrobromic acid, phosphoric acid, and the like. In an embodiment, the inorganic flux includes an inorganic salt such as a halide salt of a metal. In an embodiment, the inorganic flux includes an inorganic salt such as zinc chloride, zinc bromide, stannous chloride, stannous bromide, stannous fluoride, sodium chloride, ammonium chloride, and the like.

In an embodiment, the liquid phase 120 includes an organic base and an organic flux. In an embodiment, the organic flux includes a water-soluble acid. In an embodiment the organic flux includes a water-soluble acid such as a carboxylic acid. In an embodiment the organic flux includes a carboxylic acid such as formic acid, acetic acid, propionic acid, amalonic acid, glycolic acid, lactic acid, glyceric acid, malic acid, tartaric acid, citric acid, and the like.

In an embodiment, the liquid phase 120 includes an organic base and a water-insoluble acid. In an embodiment the water-insoluble acid is selected from stearic acid, oleic acid, benzoic acid, salicylic acid, succinic acid, adipic acid, azelaic acid, and the like. In an embodiment, the flux includes nitrogen-containing compounds selected from amines, amides, hydrohalic derivatives of the amines and acids.

FIG. 2B is the detail section 201 taken from FIG. 1D during further processing according to an embodiment. During processing, the solder suspension 118, as depicted in FIG. 2A, begins to lose the fluid phase 120, and the solder suspension 119, as depicted in FIG. 2B, shrinks in size and begins to consolidate as a gravity and surface tension-compressed solder powder composite.

FIG. 3B is a detail section 301 taken from FIG. 2B according to an embodiment. The solder suspension 301 has been consolidated around the solid phase 122. Where solder-suspension processing is carried out substantially below the liquidus temperature of the solid phase 122, the solder suspension 119 shrinks while the liquid phase 120 becomes a fugitive material. Consolidation of the solid phase 122 is depicted such that the solid phase 122 becomes a close-packed material. In an embodiment, the flux remains with the solid phase 122 until the solder suspension 119 approaches the liquidus temperature of the solid phase 122, as it exists in the minute-particle dimensions set forth in this disclosure. In an embodiment, the solder suspension 119, which includes at least portions of the flux, begins to melt in a temperature range at or below about 400° C.

In an embodiment, complete melting reflow of the solder suspension 119 is reserved for later methods of assembling the substrate 103 (FIG. 1D) into a package with a die, for example. In an embodiment, reflow of the solder suspension 119 results in destruction of the solder particles in the solid phase 122, but the resultant grain size is in a range from about 5 micrometer (μm) to about 20 μm.

In an embodiment, a process includes imposing a solder suspension on a board by any method such as dipping, spraying, or spinning. Next, the solder suspension is caused to concentrate above a bond pad and to avoid the bond-pad resist area due to differential wetting responses therebetween. Next, the solder suspension is consolidated in the solid phase consisting of the solder. Thereafter, a solder bump is achieved with a grain size in a range from about 5 μm to about 20 μm.

FIG. 4 is a cross section of a microelectronic device package 400 during an assembly method according to an embodiment. The package 400 includes a die 424 including a plurality of die bond pads, one of which is designated with the reference numeral 426. The package 400 also includes the remainder of a solder suspension 419 according to any of the solid suspension embodiments set forth in this disclosure. The die 424 is coupled to a substrate 410 through the solder suspension 419, which acts as an electrical bump therebetween. Electrical coupling of the die 424 to the substrate 410 is completed through a bond pad 412 that is aligned to a given die bond pad 426. Further communication for the microelectronic device package 400 is carried out by a plurality of board-side bond pads, one of which is designated with the reference numeral 428.

In an embodiment, the die bond pad 426 is a copper upper metallization that can touch any one of several metallization layers. For example, a metallization such as metal one in a simple microelectronic device makes electrical contact with the die bond pad 426. In another example, a metallization such as metal two makes electrical contact with the die bond pad 426. The metal two makes electrical contact with the metal one. In another example, a metallization such as metal three makes electrical contact with the die bond pad 426. The metal three makes-electrical contact with the metal two, which in turn makes electrical contact with the metal one. In another example, a metallization such as metal four makes electrical contact with the die bond pad 426. The metal four makes electrical contact with the metal three. The metal three makes electrical contact with the metal two, which in turn makes electrical contact with the metal one. In another example, a metallization such as metal five makes electrical contact with the die bond pad 426. The metal five makes electrical contact with the metal four. The metal four makes electrical contact with the metal three. The metal three makes electrical contact with the metal two, which in turn makes electrical contact with the metal one. In another example, a metallization such as metal six makes electrical contact with the die bond pad 426. The metal six makes electrical contact with the metal five. The metal five makes electrical contact with the metal four. The metal four makes electrical contact with the metal three. The metal three makes electrical contact with the metal two, which in turn makes electrical contact with the metal one. In another example, a metallization such as metal seven makes electrical contact with the die bond pad 426. The metal seven makes electrical contact with the metal six. The metal six makes electrical contact with the metal five. The metal five makes electrical contact with the metal four. The 514 makes electrical contact with the metal three. The metal three makes electrical contact with the metal two, which in turn makes electrical contact with the metal one. By this disclosure, it becomes clear that various semiconductor substrate structures are applicable to the various embodiments.

FIG. 5 is a cross section of a microelectronic device package 500 according to an embodiment. The package 500 includes a die 524 including a plurality of die bond pads, one of which is designated with the reference numeral 526. The microelectronic package 500 includes a die 524 on a substrate 510, which in turn has been mounted upon a board 530. In an embodiment, the substrate 510 has been bonded to the die 524 through an embodiment of a solder suspension 519, as set forth in this disclosure. In an embodiment, the solder suspension 519 includes any metal particle composition embodiment set forth in this disclosure. In an embodiment, the board 530 is similarly bonded to the substrate 510 by a solder suspension 532, which has optionally been formed according to any of the embodiments set forth in this disclosure.

FIG. 6 is a process flow diagram according to various embodiments. Processing of the fluxed solder suspension 119 (e.g., FIG. 1D) is carried out during a process of forming a solder bump, and during a method of assembling a packaged die, respectively.

At 610, the process includes optionally pretreating a substrate to impose preferential wetting areas. By way of example, the substrate 100 in FIG. 1A, is pretreated. Pretreatment can be exposure to an $O_2$ plasma, followed by a $CF_4$ plasma, and an enhanced hydrophobicity results at the bond-pad resist area 108. Further, the bond pad 112 is hydrophilic.

At 620, a fluxed solder suspension is patterned on the substrate. By way of illustration in FIG. 1D, the solder suspension 118 has migrated away from the bond-bad resist area 108, and has adhered to the bond pad 112 by preferential wetting according to an embodiment.

At 630, the fluxed solder suspension is treated to remove at least some fluid phase to cause the fluid phase to be reduced in volume, and to cause the flux to begin to activate. By way of example, the solder suspension 119 is heated to allow the fluid phase 120 to volatilize, while the flux begins to activate. In an embodiment, the solid phase 122 becomes close-packed and optionally begins to consolidate as a reflow composition with a grain size no larger than about 20 µm, although larger grain sizes can occur.

At 640, the solder suspension, or the substantially nonvolatile remnants thereof, is reflowed into a solder bump on the substrate. By way of illustration in FIG. 1D, the reflowed solder suspension remnant 119 is depicted as forming a solder bump. At 641, the process flow can proceed from the process of reflowing the fluxed solder suspension, to the method of assembling a die to the substrate to form a microelectronic die package. At 642, one process embodiment is completed.

At 650, a die and the substrate, including the fluxed solder suspension, are assembled into a package. By way of illustration, FIGS. 4 and 5 depict the assembly of a die with at least a mounting substrate 410 and 510, respectively. At 651, the process flow can proceed from the method of assembling the die and substrate into a package, followed by the process of reflowing the fluxed solder suspension into a solder bump. At 652, one method embodiment is completed.

Figure 7:
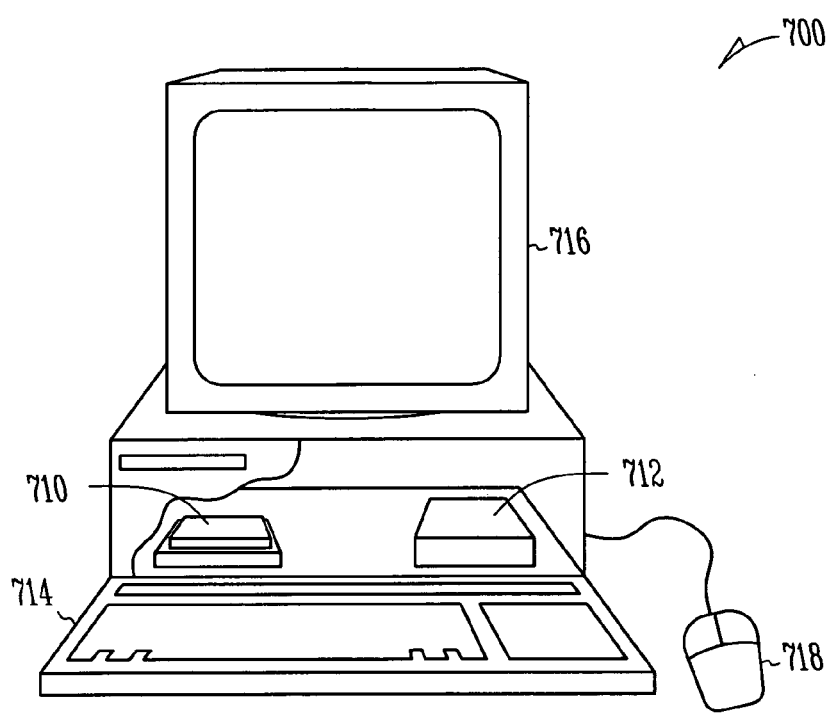
FIG. 7 is a depiction of a computing system according to an embodiment.

FIG. 7 is a cut-away elevation that depicts a computing system 700 according to an embodiment. One or more of the foregoing embodiments of the fluxed solder suspension may be utilized in a computing system, such as a computing system 700 of FIG. 7. Hereinafter any embodiment alone or in combination with any other embodiment is referred to as an embodiment(s) configuration.

The computing system 700 includes at least one processor (not pictured), which is enclosed in a package 710, a data storage system 712, at least one input device such as keyboard 714, and at least one output device such as monitor 716, for example. The computing system 700 includes a processor that processes data signals, and may include, for example, a microprocessor, available from Intel Corporation. In addition to the keyboard 714, the computing system 700 can include another user input device such as a mouse 718, for example. The computing system 700 can be analogous to the package 400 and the package 500, which include a die, a mounting substrate, the fluxed solder suspension, and in FIG. 5, a board. Consequently the package 710 (including a die and a fluxed solder suspension) and the board 720 are analogous to these structures.

For purposes of this disclosure, a computing system 700 embodying a solder bump that was reflowed from a fluxed solder suspension in accordance with the claimed subject matter may include any system that utilizes a microelectronic device system. For example, at least one of a solder bump that was reflowed from a fluxed solder suspension is coupled to data storage such as dynamic random access memory (DRAM), polymer memory, flash memory, and phase-change memory. In this embodiment, a solder bump that was reflowed from a fluxed solder suspension is coupled to any combination of these functionalities by being coupled to a processor. In an embodiment, however, a solder bump that was reflowed from a fluxed solder suspension set forth in this disclosure is coupled to any of these functionalities. For an example embodiment, data storage includes an embedded DRAM cache on a die. Additionally in an embodiment, a solder bump that was reflowed from a fluxed solder is coupled to the processor (not pictured) is part of the system with a solder bump that is coupled to the data storage of the DRAM cache. Additionally in an embodiment, a solder bump that was reflowed from a fluxed solder suspension is coupled to the data storage 712.

In an embodiment, the computing system can also include a die that contains a digital signal processor (DSP), a micro controller, an application specific integrated circuit (ASIC), or a microprocessor. In this embodiment, a solder bump that was reflowed from a fluxed solder suspension is coupled to any combination of these functionalities by being coupled to a processor. For an example embodiment, a DSP (not pictured) is part of a chipset that may include a stand-alone processor (in package 710) and the DSP as separate parts of the chipset on the board 720. In this embodiment, a solder-bump embodiment configuration is coupled to the DSP, and a separate solder-bump embodiment may be present that is coupled to the processor in package 710. Additionally in an embodiment, a solder-bump embodiment is coupled to a DSP that is mounted on the same board 720 as the package 710. It can now be appreciated that the solder-bump embodiment can be combined as set forth with respect to the computing system 700, in combination with any solder-bump embodiment as set forth by the various embodiments of this disclosure and their equivalents.

It can now be appreciated that embodiments set forth in this disclosure can be applied to devices and apparatuses other than a traditional computer. For example, a die can be packaged with a solder-bump embodiment, and placed in a portable device such as a wireless communicator or a hand-held device such as a personal data assistant and the like. Another example is a die that can be packaged with a solder-bump embodiment and placed in a vehicle such as an automobile, a locomotive, a watercraft, an aircraft, or a spacecraft.

The Abstract is provided to comply with 37 C.F.R. § 1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   imposing a differential wetting response for a solder suspension upon a portion of a substrate, the substrate wherein imposing the differential wetting response is selected from pretreating the substrate using a plasma or soaking process including a bond pad and a bond-pad resist area;
   applying the solder suspension to the substrate; and
   causing the solder suspension to draw toward the bond pad and away from the bond-pad resist area.

2. The process of claim 1, wherein imposing a differential wetting response includes pre-treating the substrate using $O_2$ plasma followed by $CF_4$ plasma to cause the bond pad to be solder-suspension philic and the solder-resist area to be solder-suspension phobic.

3. The process of claim 1 wherein imposing a differential wetting response includes soaking the substrate using ethanolic alkanethiol [$CH_3 (CH_2)_n SH$] solution to cause the bond pad to be solder-suspension philic and the solder-resist area to be solder-suspension phobic.

4. The process of claim 1, wherein applying is selected from dipping the substrate in the solder suspension, spinning the solder suspension onto the substrate, spraying the solder suspension onto the substrate, and combinations thereof.

5. The process of claim 1, wherein causing the solder suspension to draw toward the bond pad includes pretreating at least one of the bond pad and the bond-pad resist area to cause a differential suspension-wetting response between the bond pad and the bond-pad resist area.

6. The process of claim 1, wherein causing the solder suspension to draw toward the bond pad includes removing at least some liquid from the solder suspension.

7. The process of claim 1, wherein applying the solder suspension to the substrate includes applying the suspension to the substrate, wherein the substrate includes a plurality of bond pads, wherein the bond pads include an edge dimension from about 50 micrometer to about 150 micrometer, wherein the bond-pad resist area is disposed between any two adjacent bond pads that share an edge border, and wherein the bond pads are spaced upon the bond-pad resist area, where a bond pad has an edge-dimension of unity, two bond pads are spaced on centers having a dimension of about 1.5 times unity.

8. The process of claim 1, further including:
   removing at least some liquid from the solder suspension; and
   reflowing solid-phase material therein, wherein the solid-phase material includes particle size distribution of at least 50% passing 20 nm.

9. The process of claim 1 further including:
   removing at least some liquid from the solder suspension; and
   reflowing solid-phase material therein, wherein reflowing is carried out under conditions to achieve a reflowed state, and wherein solid-phase material exists in the reflowed state to include a grain size in a range of less than or equal to about 20 micrometer (μm).

10. The process of claim 1, further including:
    removing at least some liquid from the solder suspension; and
    reflowing solid-phase material therein wherein reflowing includes a reflow temperature below about 400° C.

11. The process of claim 1, further including:
    removing at least some liquid from the solder suspension; and
    reflowing solid-phase material therein wherein reflowing occurs against at least one structure selected from a microelectronic die, a second-level mounting substrate, and a first-level board.

12. A process comprising:
    imposing a differential wetting response for a solder suspension upon a portion of a substrate, the substrate wherein imposing the differential wetting response is selected from pretreating the substrate using a plasma or soaking process including a bond pad and a bond-pad resist area;
    applying the solder suspension to the substrate;
    causing the solder suspension to draw toward the bond pad and away from the bond-pad resist area;
    removing at least some liquid from the solder suspension; and
    reflowing solid-phase material therein.

13. The process of claim 12, wherein applying is selected from dipping the substrate in the solder suspension, spinning the solder suspension onto the substrate, spraying the solder suspension onto the substrate, and combinations thereof.

14. The process of claim 12, wherein imposing a differential wetting response includes one of:
    pre-treating the substrate using $O_2$ plasma followed by $CF_4$ plasma to cause the bond pad to be solder-suspension philic and the solder-resist area to be solder-suspension phobic; or
    soaking the substrate using ethanolic alkanethiol [$CH_3 (CH_2)_n SH$] solution to cause the bond pad to be solder-suspension philic and the solder-resist area to be solder-suspension phobic.

15. The process of claim 12, wherein applying includes applying the solder suspension with a solid phase including a particle size distribution of about 50% passing 20 nm.

16. A process comprising:
    imposing a differential wetting response for a solder suspension upon a portion of a substrate, the substrate wherein imposing the differential wetting response is selected from pretreating the substrate using a plasma or soaking process including a bond pad and a bond-pad resist area;
    applying the solder suspension to the substrate, wherein the solder suspension has a solid phase including a particle size distribution of about 50% passing 20 nm, and wherein the solid phase is selected from copper, silver, gold, lead, tin, and combinations thereof;
    causing the solder suspension to draw toward the bond pad and away from the bond-pad resist area;
    removing at least some liquid from the solder suspension; and reflowing solid-phase material therein, wherein reflowing includes a reflow temperature below about 400° C.

17. The process of claim 16, wherein imposing a differential wetting response includes one of:
pre-treating the substrate using $O_2$ plasma followed by $CF_4$ plasma to cause the bond pad to be solder-suspension philic and the solder-resist area to be solder-suspension phobic; or
soaking the substrate using ethanolic alkanethiol [$CH_3(CH_2)_n$ SH] solution to cause the bond pad to be solder-suspension philic and the solder-resist area to be solder-suspension phobic.

18. The process of claim 16, wherein applying is selected from dipping the substrate in the solder suspension, spinning the solder suspension onto the substrate, spraying the solder suspension onto the substrate, and combinations thereof.

19. The process of claim 16, wherein reflowing is carried out under conditions to achieve a reflowed state, and wherein solid-phase material exists in the reflowed state to include a grain size in a range of less than or equal to about 20 micrometer (μm).

20. The process of claim 16, wherein reflowing occurs against at least one structure selected from a microelectronic die, a second-level mounting substrate, and a first-level board.

21. A process comprising:
imposing a differential wetting response for a solder suspension upon a portion of a substrate, the substrate including a bond pad and a bond-pad resist area, wherein imposing a differential wetting response includes one of:
pre-treating the substrate using $O_2$ plasma followed by $CF_4$ plasma to cause the bond pad to be solder-suspension philic and the solder-resist area to be solder-suspension phobic; or
soaking the substrate using ethanolic alkanethiol [$CH_3(CH_2)_n$ SH] solution to cause the bond pad to be solder-suspension philic and the solder-resist area to be solder-suspension phobic;
applying the solder suspension to the substrate, wherein the solder suspension includes a percent solids in a range from about 30% to about 90%, wherein the solder suspension has a solid phase including a particle size distribution of about 50% passing 20 nm, and wherein the solid phase is selected from copper, silver, gold, lead, tin, and combinations thereof;
causing the solder suspension to draw toward the bond pad and away from the bond-pad resist area;
removing at least some liquid from the solder suspension by heating the solder suspension; and
reflowing solid-phase material therein, wherein reflowing is carried out under conditions to achieve a reflowed state, and wherein solid-phase material exists in the reflowed state to include a grain size in a range of less than or equal to about 20 micrometer (μm).

22. The process of claim 21, wherein reflowing occurs against at least one structure selected from a microelectronic die, a second-level mounting substrate, and a first-level board.

23. The process of claim 21, wherein applying is selected from dipping the substrate in the solder suspension, spinning the solder suspension onto the substrate, spraying the solder suspension onto the substrate, and combinations thereof.

* * * * *